(12) United States Patent
Gong et al.

(10) Patent No.: US 11,316,136 B2
(45) Date of Patent: Apr. 26, 2022

(54) MANUFACTURING METHOD OF FLEXIBLE DISPLAY DEVICE AND FLEXIBLE DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Kui Gong, Beijing (CN); Xianxi Cui, Beijing (CN); Xianxue Duan, Beijing (CN); Zhihai Zhang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 379 days.

(21) Appl. No.: 16/473,402

(22) PCT Filed: Jan. 10, 2019

(86) PCT No.: PCT/CN2019/071163
§ 371 (c)(1),
(2) Date: Jun. 25, 2019

(87) PCT Pub. No.: WO2019/227940
PCT Pub. Date: Dec. 5, 2019

(65) Prior Publication Data
US 2021/0343992 A1    Nov. 4, 2021

(30) Foreign Application Priority Data

May 28, 2018 (CN) .......................... 201810523678.6

(51) Int. Cl.
*H01L 51/56* (2006.01)
*H01L 51/00* (2006.01)
*H01L 27/32* (2006.01)

(52) U.S. Cl.
CPC .......... *H01L 51/56* (2013.01); *H01L 51/0097* (2013.01); *H01L 27/3244* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| 9,614,190 B2 * | 4/2017 | Ko | ...................... H01L 51/0097 |
| 2012/0228617 A1 * | 9/2012 | Ko | .......................... H01L 51/529 |
| | | | 257/59 |

(Continued)

FOREIGN PATENT DOCUMENTS

| CN | 102683379 A | 9/2012 |
| CN | 105185813 A | 12/2015 |

(Continued)

OTHER PUBLICATIONS

International Search Report and Written Opinion dated Apr. 9, 2019; PCT/CN2019/071163.

*Primary Examiner* — J. E. Schoenholtz

(57) ABSTRACT

A manufacturing method of a flexible display device and a flexible display device are provided. The manufacturing method of the flexible display device includes: forming a conductive heating layer with a first microstructure pattern on a hard substrate; forming a flexible substrate layer on the conductive heating layer, and forming a display device on the flexible substrate layer; performing a heating treatment on the conductive heating layer to separate the flexible substrate layer from the conductive heating layer, and a side of the flexible substrate layer away from the display device having a second microstructure pattern after being separated.

18 Claims, 5 Drawing Sheets

(56) References Cited

U.S. PATENT DOCUMENTS

2015/0188080 A1* 7/2015 Choi .................. H01L 51/5221
                                                              257/88
2016/0315227 A1* 10/2016 Kang ................ H01L 21/7688
2017/0069878 A1* 3/2017 Hsieh ................ H01L 51/0097

FOREIGN PATENT DOCUMENTS

| CN | 106356472 A | 1/2017 |
| CN | 108470855 A | 8/2018 |
| KR | 1020100068661 A | 6/2010 |

* cited by examiner

MANUFACTURING METHOD OF FLEXIBLE DISPLAY DEVICE AND FLEXIBLE DISPLAY DEVICE

This application claims priority to Chinese Patent Application No. 201810523678.6 filed on May 28, 2018, the disclosure of which is incorporated herein by reference in its entirety as part of this application.

TECHNICAL FIELD

The disclosure relates to a manufacturing method of a flexible display device and a flexible display device.

BACKGROUND

With the development of display technology and the continuous improvement of people's requirements for products, people are pursuing light, thin and narrow borders while pursuing high resolution. In addition, the requirements for the display device are no longer limited to the flat display, but the curved surface and more stereoscopic display effect are desired. Therefore, flexible display technology comes into being.

In the prior display technology, the manufacturing process of a flexible display which is widely applied is as follows: a flexible substrate layer with water and oxygen blocking performance is manufactured on a hard substrate, then a Thin Film Transistor (TFT) circuit and an organic electroluminance display (OLED) are manufactured on the flexible substrate, devices are packaged by using a coating encapsulation technology, and the flexible display is removed from the hard substrate by laser scanning the bottom of the hard substrate after the display product is manufactured. However, because the laser scanning process is not easy to control, when the flexible display is removed from the hard substrate, it generates more heat and has poor heat dissipation effect, causing greater damage to the flexible substrate and TFT circuit, resulting in an increase in product failure rate. On the other hand, using laser scanning to separate the hard substrate and the flexible display has higher cost.

SUMMARY

An embodiment of the disclosure provides a manufacturing method of a flexible display device, comprising: forming a conductive heating layer with a first microstructure pattern on a hard substrate; forming a flexible substrate layer on the conductive heating layer, and forming a display device on the flexible substrate layer; and performing a heating treatment on the conductive heating layer to separate the flexible substrate layer from the conductive heating layer, and a side of the flexible substrate layer away from the display device having a second microstructure pattern after being separated.

In some examples, forming the conductive heating layer with the first microstructure pattern on the hard substrate comprises: forming a conductive heating film on the hard substrate; and performing a patterning process on the conductive heating film to form the conductive heating layer with the first microstructure pattern.

In some examples, forming the flexible substrate layer on the conductive heating layer comprises: forming a first flexible base layer, a heat dissipation layer and a second flexible base layer on the conductive heating layer sequentially.

In some examples, in the flexible substrate layer after being separated, a side of the first flexible base layer away from the display device has the second microstructure pattern.

In some examples, the first flexible base layer and the second flexible base layer are made of polyimide fibers, and both the first flexible base layer and the second flexible base layer have a thickness from 10 microns to 50 microns.

In some examples, the heat dissipation layer is a transparent graphene layer including a plurality of transparent graphene films, and the heat dissipation layer has a thickness from 5 microns to 25 microns.

In some examples, the display device is an organic light emitting diode device, and forming the display device on the flexible substrate layer comprises: forming a thin film transistor layer, an organic light emitting diode layer and an encapsulation layer on the second flexible base layer sequentially.

In some examples, the encapsulation layer and the flexible substrate layer form an encapsulated space, and the thin film transistor layer and the organic light emitting diode layer are encapsulated in the encapsulated space.

In some examples, the second microstructure pattern on the side of the flexible substrate layer away from the display device and the first microstructure pattern of the conductive heating layer are complementary patterns.

In some examples, a material of the conductive heating layer comprises at least one of iron chromium alloy or nickel chromium alloy.

In some examples, the first microstructure pattern of the conductive heating layer is a grid pattern or a dot array pattern.

An embodiment of the disclosure provides a flexible display device comprising: a flexible substrate layer and a display device disposed on the flexible substrate layer; wherein a side of the flexible substrate layer away from the display device is provided with a microstructure pattern.

In some examples, the microstructure pattern is a grid pattern or a dot array pattern protruding from a surface of the flexible substrate layer.

In some examples, the flexible substrate layer comprises: a second flexible base layer, a heat dissipation layer and a first flexible base layer which are sequentially arranged in a direction from a position close to the display device to a position away from the display device; the microstructure pattern is provided on a side of the first flexible base layer away from the display device.

In some examples, the first flexible base layer and the second flexible base layer are made of polyimide fibers, and both the first flexible base layer and the second flexible base layer have a thickness from 10 microns to 50 microns.

In some examples, the heat dissipation layer is a transparent graphene layer including a plurality of transparent graphene films, and the heat dissipation layer has a thickness from 5 microns to 25 microns.

In some examples, the display device is an organic light emitting diode device, and the organic light emitting diode device comprises a thin film transistor layer, an organic light emitting diode layer and an encapsulation layer which are sequentially arranged in a direction away from the second flexible base layer.

In some examples, the encapsulation layer and the flexible substrate layer form an encapsulated space in which the thin film transistor layer and the organic light emitting diode layer are encapsulated.

In some examples, the microstructure pattern is generated after a patterned conductive heating layer on a hard substrate is heated and the flexible substrate layer is separated from the patterned conductive heating layer.

In some examples, the microstructure pattern on the side of the flexible substrate layer away from the display device and a pattern of the conductive heating layer are complementary patterns.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The following several specific embodiments provided by the present invention can be combined with each other, and the same or similar concepts or processes may not be repeated in some embodiments.

Figure 1:
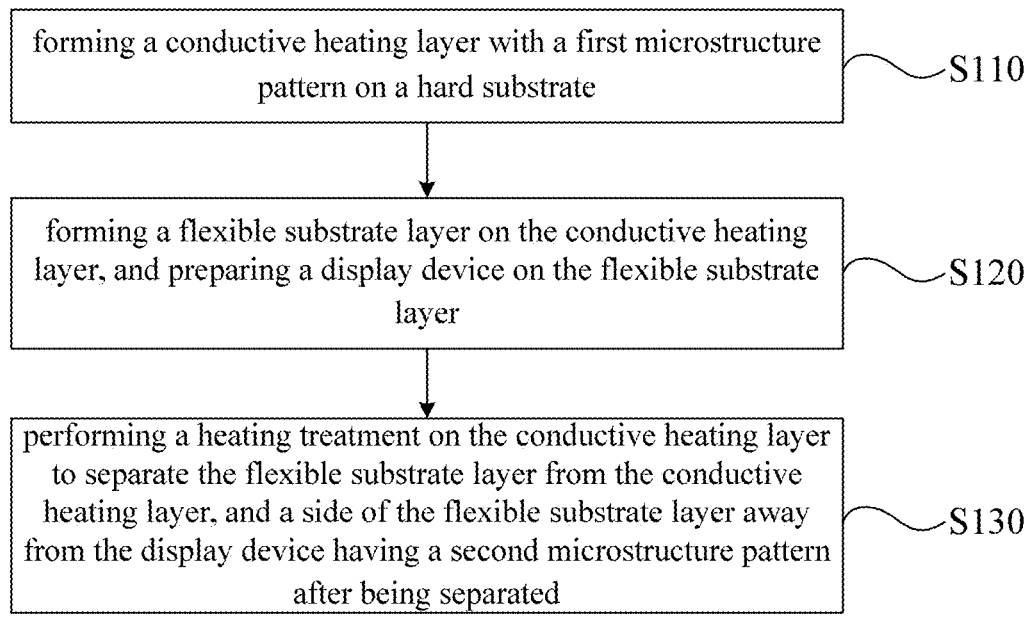
FIG. 1 is a flowchart of a manufacturing method of a flexible display device provided by an embodiment of the disclosure.

FIG. 1 is a flowchart of a manufacturing method of a flexible display device provided by an embodiment of the disclosure. The method provided in this embodiment can be applied to the process of manufacturing a flexible display device. The manufacturing method of the flexible display device provided in this embodiment can include the following steps S110-S130.

S110, a conductive heating layer having a microstructure pattern is formed on the hard substrate.

S120, a flexible substrate layer is formed on the conductive heating layer, and a display device is prepared on the flexible substrate layer.

According to the manufacturing method of the flexible display device provided by the embodiment of the disclosure, the flexible display device can be manufactured on a hard substrate of a common display device, and the flexible display device has a flexible substrate layer, so that the prepared flexible display device has a stretchable function, and can form a curved surface or other display device with a three-dimensional display effect. In addition, due to the high stretchability of the flexible substrate layer itself, it is difficult to directly manufacture a display device on the flexible substrate layer, therefore, the flexible substrate layer can be manufactured on a hard substrate firstly to have high stability in the manufacturing process, and then the display device can be manufactured on the flexible substrate layer with a fixed structure. Since the display device in the embodiment of the present disclosure is formed on the flexible substrate layer, the display device also has certain deformation performance based on the deformation characteristics of the flexible substrate layer. The display device may be, for example, a TFT circuit and an OLED device.

It should be noted that considering the influence of heat dissipation effect on the flexible display device in the process of separating the flexible display device from the hard substrate in the related art, the embodiment of the present disclosure firstly makes a conductive heating layer on the hard substrate before making the flexible substrate layer, and the conductive heating layer is not a planar layer with uniform thickness, but a heatable metal layer with microstructure pattern, and the conductive heating layer with microstructure pattern not only plays a role of heat dissipation effect but also has great significance for the light emission effect of the flexible display device in the following.

Figure 2:
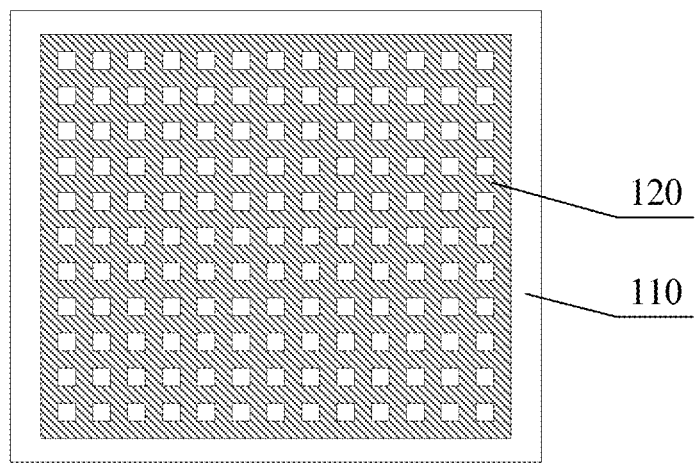
FIG. 2 is a schematic structural diagram of a conductive heating layer in the manufacturing method of the flexible display device provided by the embodiment of the disclosure.

In the embodiment of the present disclosure, after the conductive heating layer having the microstructure pattern is fabricated on the hard substrate, the flexible substrate layer can be fabricated on the conductive heating layer. The pattern of the conductive heating layer may be, for example, a grid pattern. As illustrated in FIG. 2, the conductive heating layer having a grid pattern is, for example, a conductive heating layer having a plurality of openings arranged in an array. FIG. 2 is a schematic structural diagram of a conductive heating layer in the manufacturing method of the flexible display device provided by an embodiment of the disclosure. The unfilled area in FIG. 2 is the hard substrate 110 exposed by the grid-like conductive heating layer, and the filled grid-like pattern is the conductive heating layer 120. The filled part inside the conductive heating layer 120 may be a convex structure of the conductive heating layer 120, while the unfilled part inside the conductive heating layer 120 may be a concave structure. For example, the conductive heating layer 120 has a structure protruding from the surface of the hard substrate 110.

For example, the conductive heating layer according to the embodiment of the present disclosure is a conductive heating layer including a partially hollowed-out structure. The ratio of the area of the hollowed-out portion to the area of the conductive heating layer itself is not particularly limited. For example, the above ratio can be adjusted according to the difficulty of peeling the flexible substrate layer. For example, the ratio of the area of the hollowed-out portion to the conductive heating layer itself may be ½ to 1. In addition, the feature size of the hollowed-out portion (for example, when the hollowed-out portion is a square opening, its side length is the feature size; or when the hollowed-out structure is a circular opening, the diameter of the hollowed-out structure is a feature size; or the width of the hollowed-out structure is a feature size when the hollowed-out structure is a strip structure) can also be adjusted as required. For example, the feature size of the hollowed-out structure is 5-30 μm. For example, the feature size of the hollowed-out structure is less than ⅓ of the thickness of the flexible substrate layer. In some examples, the feature size of the hollowed-out structure is less than ¼, ⅕ or the like of the thickness of the flexible substrate layer.

It should be noted that FIG. 2 only illustrates one possible structural feature of the conductive heating layer. The pattern of the conductive heating layer may also be a dot matrix pattern or a pattern of other shapes, as long as the conductive heating layer with the microstructure pattern is not a planar layer with uniform thickness but has a concave-convex pattern structure, and the formed concave-convex pattern structure can provide good heat dissipation effect when separating the hard substrate, it can be used as the microstructure pattern of the conductive heating layer in the embodiment of the present disclosure.

S130, the conductive heating layer is subjected to a heating treatment to separate the flexible substrate layer from the conductive heating layer, and the side of the separated flexible substrate layer away from the display device has a microstructure pattern.

According to the manufacturing method of the flexible display device provided by the embodiment of the disclosure, after the manufacturing of the display device is completed, in order to enable the display device to have stretchable flexibility, the hard substrate needs to be peeled off from the entire display device, i.e., the hard substrate and the flexible substrate layer need to be separated. In the manufacturing method provided by the embodiment of the disclosure, based on the structural characteristics that the conductive heating layer has been formed on the hard substrate, and the conductive heating layer is arranged on a side of the hard substrate close to the flexible substrate layer, the conductive heating layer on the hard substrate can be heated by electrifying, so that the conductive heating layer generates enough heat to separate the conductive heating layer from the flexible substrate layer, thus realizing the effect of separating the hard substrate from the flexible substrate layer. In the heating separation process, the heat generated by the conductive heating layer peels the flexible substrate layer from the conductive heating layer at the junction of the flexible substrate layer and the conductive heating layer. The concave-convex structure on the microstructure pattern has the effect of uniform heating, and the heating time and temperature are easy to control, thus avoiding the influence of excessive local heat on the performance of the display device and improving the manufacturing yield of the flexible display device to a certain extent.

In the embodiment of the present disclosure, the side of the separated flexible substrate layer away from the display device has the microstructure pattern. Referring to the microstructure pattern of the conductive heating layer illustrated in FIG. 2, the microstructure pattern of the side of the flexible substrate layer away from the display device and the microstructure pattern of the conductive heating layer are complementary patterns. For example, when forming the flexible substrate layer on the patterned conductive heating layer, the flexible substrate layer will be filled to the position where there is no conductive heating layer pattern, so the microstructure pattern of the conductive heating layer can be complementary to the microstructure pattern of the flexible substrate layer. Taking the grid pattern illustrated in FIG. 2 as an example, the flexible substrate layer is formed on the conductive heating layer illustrated in FIG. 2, the microstructure pattern of on the side of the flexible substrate layer away from the display device is a dot matrix pattern after being separated from the conductive heating layer, that is, the pattern structure of the unfilled portion inside the conductive heating layer 120 illustrated in FIG. 2. For example, the side of the flexible substrate layer away from the display device has a bump structure distributed in an array. In addition, the microstructure pattern formed on the side of the flexible substrate layer away from the display device after the conductive heating layer is separated is beneficial to improving the light extraction efficiency, thereby further improving the service life of the display device.

In the related art, the way to separate the flexible display device from the hard substrate is to separate the flexible display device from the hard substrate by laser scanning the bottom of the hard substrate, which is actually to heat the hard substrate to realize the separation of the hard substrate and the flexible substrate layer. However, due to poor heat dissipation effect, the flexible substrate layer and TFT circuit are damaged to a greater extent in this separation technology, resulting in an increase in defect rate. In addition, the process is not easy to control and the cost is relatively high by using laser scanning to separate the hard substrate and the flexible display.

According to the manufacturing method of the flexible display device provided by the embodiment of the disclosure, a conductive heating layer with a microstructure pattern is formed on a hard substrate, and a flexible substrate layer is formed on the conductive heating layer; after a display device is prepared on the flexible substrate layer, the flexible substrate layer is separated from the conductive heating layer through heating treatment on the conductive heating layer, and the separated flexible substrate layer has a microstructure pattern on the side away from the display device. The manufacturing method of the flexible display device provided by the disclosure can not only avoid damage to the display device caused by laser energy in the traditional separation process, thereby improving the service life of the display device, but also can improve the light extraction efficiency and further improve the service life of the display device because the prepared flexible substrate layer has a microstructure pattern on the side away from the display device.

Furthermore, in the embodiment of the disclosure, the separation method of conductive heating is adopted, so that the process controllability is high and the cost is low.

Optionally, in the embodiment of the present disclosure, the manufacturing method of the conductive heating layer with microstructure pattern may include the following steps 1-2.

Step 1, forming a conductive heating film on the hard substrate.

Figure 3:
FIG. 3 is a schematic diagram of a process in the manufacturing method of the flexible display device provided by the embodiment of the disclosure.

FIG. 3 is a schematic diagram of a process in a manufacturing method of a flexible display device according to an embodiment of the disclosure. The material of the hard substrate 110 in the embodiment of the present disclosure may be a transparent hard material, such as glass or quartz.

The conductive heating film 120*a* may be formed on the hard substrate 110 by a film forming method such as magnetron sputtering, and the conductive heating film 120*a* may be made of iron chromium alloy or nickel chromium alloy. For example, the prepared conductive heating layer with microstructure pattern is made of iron-chromium alloy or nickel-chromium alloy to form a thin film layer with electric heating capability, with a thickness of 10-500 nanometers (nm), for example.

Step 2, patterning the conductive heating film layer to form a conductive heating layer with microstructure patterns.

The step of patterning the conductive heating film layer may include steps 11-12.

Step 11, processing the conductive heating film layer through a mask process to form a mask pattern layer above the conductive heating film layer.

Figure 4:
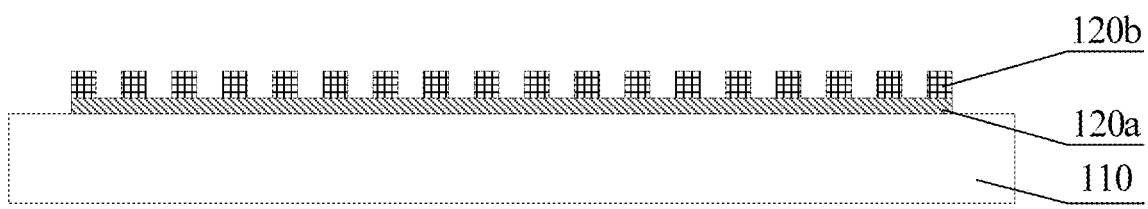
FIG. 4 is a schematic diagram of a process in the manufacturing method of the flexible display device provided by the embodiment of the disclosure.

FIG. 4 is a schematic diagram of a process in the manufacturing method of the flexible display device provided by the embodiment of the disclosure. A photoresist mask pattern layer 120*b* is formed over the conductive heating film 120*a* by photolithography processes such as applying photoresist, exposure, development, etc.

Step 12, etching the structure (conductive heating film with mask pattern) in step 11 to form the conductive heating layer with the microstructure pattern.

Figure 5:
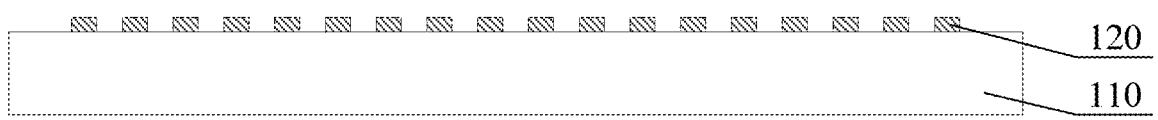
FIG. 5 is a schematic diagram of a process in the manufacturing method of the flexible display device provided by the embodiment of the disclosure.

FIG. 5 is a schematic diagram of a process in the manufacturing method of the flexible display device provided by the embodiment of the disclosure. The conductive heating film 120*a* with the mask pattern is etched by dry etching or wet etching to produce the conductive heating layer 120 with the microstructure pattern. The side view structure of the conductive heating layer 120 is illustrated in FIG. 5. The top view structure of the conductive heating layer 120 can be illustrated in FIG. 2. The structure of the conductive heating layer 120 illustrated in FIG. 2 is only a schematic illustration, which does not necessarily mean that the conductive heating layer 120 must be a grid-like pattern structure, and it can be a dot matrix pattern structure or other pattern structure, as long as uniform heating can be achieved and the effect of effectively separating the hard substrate and the flexible substrate layer can be achieved.

Optionally, in the embodiment of the present disclosure, the implementation of forming the flexible substrate layer on the conductive heating layer may include sequentially forming a first flexible base layer, a heat dissipation layer and a second flexible base layer on the conductive heating layer.

Figure 6:
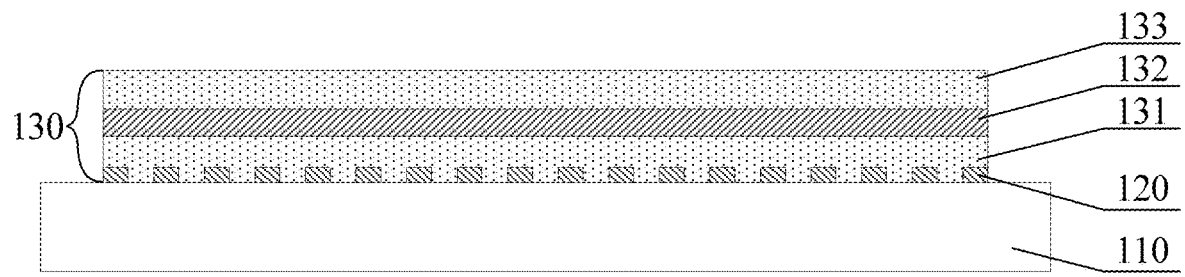
FIG. 6 is a schematic diagram of a process in the manufacturing method of the flexible display device provided by the embodiment of the disclosure.

FIG. 6 is a schematic diagram of a process in the manufacturing method of the flexible display device provided by the embodiment of the disclosure. The flexible substrate layer 130 in the embodiment of the present disclosure is a multi-layer structure. The multilayer structure may include, for example, a first flexible base layer 131, a heat dissipation layer 132, and a second flexible base layer 133. For example, the side of the first flexible base layer 131 close to the hard substrate 110 is bonded to the conductive heating layer 120 (or the conductive heating layer 120 and the hard substrate 110), and the display device is prepared on the side of the second flexible base layer 133 away from the first flexible base layer 131. In some examples, a heat dissipation layer 132 is provided on the side of the second flexible base layer 133 away from the display device. The heat dissipation layer 132 is used to effectively dissipate heat and reduce local thermal effects when the flexible display device is separated by being heated through electricity, thereby blocking the influence of high temperature on the display device and improving the product yield of the flexible display device.

It should be noted that based on the multi-layer structure of the flexible substrate layer 130 illustrated in FIG. 6, it can be seen that the first flexible base layer 131 is bonded to the hard substrate 110 and the conductive heating layer 120 on the hard substrate 110, and the outermost layer at the bottom of the separated flexible display device (i.e., the outermost layer facing away from the display device in the flexible display device) is the first flexible base layer 131. Therefore, in the separated flexible substrate layer 130, the side of the first flexible base layer 131 away from the display device has a microstructure pattern, and the microstructure pattern of the side of the first flexible base layer 131 away from the display device and the microstructure pattern of the conductive heating layer 120 are complementary patterns, and reference can be made to the filled region and the unfilled region in FIG. 2.

In some examples, the manufacturing method of the multilayer structure for manufacturing the flexible substrate layer 130 may include the following steps 10-30.

In step 10, a first flexible base layer 131 is fabricated on the conductive heating layer 120 having the microstructure pattern by spraying or coating.

Optionally, the first flexible base layer 131 in the embodiment of the present disclosure may be made of polymide film (PI). For example, the thickness of the first flexible base layer 131 may be from 10 microns to 50 microns (μm). The PI after film formation is planarized to form the upper surface of the first flexible base layer 131, with reference to the structure illustrated in FIG. 6.

Step 20, a heat dissipation layer 132 is prepared on the first flexible base layer 131.

In the embodiment of the present disclosure, the heat dissipation layer 132 can be made of a material with strong heat conduction and heat dissipation performance, thereby achieving a good heat dissipation effect. Alternatively, if the flexible display device is a double-sided or bottom-emitting OLED display, the heat dissipation layer 132 may be a transparent graphene layer.

In some examples, the transparent graphene layer may be composed of, for example, a plurality of transparent graphene films sequentially attached to the first flexible base layer 131. The transparent graphene is currently the thinnest but hardest nano material, almost completely transparent, and has a thermal conductivity of up to 5300 Watts/Meter·degrees (W/m·K), higher than carbon nanotubes and diamond, thus having high thermal conductivity and heat dissipation performance.

In one implementation of the embodiment of the present disclosure, the thickness of the transparent graphene layer may be from 5 to 25 μm. According to the thickness calculation of the transparent graphene film, the heat dissipation layer 132 may include approximately 14900 to 74600 layers of transparent graphene films.

In another implementation of the embodiment of the present disclosure, a transparent graphene material of 5-25 μm may be uniformly deposited on the first flexible base layer 131 to obtain the heat dissipation layer 132.

In step 30, a second flexible base layer 133 is fabricated on the upper surface of the heat dissipation layer 132 by spraying or coating.

In the embodiment of the present disclosure, the manufacturing process, material selection and thickness of the second flexible base layer 133 may be the same as that of the first flexible base layer 131, i.e., PI material may also be used, and the thickness may be from 10 to 50 μm. The specific structural position is illustrated in FIG. 6. The material selection and thickness of the first flexible base layer 131 and the second flexible base layer 133 are determined according to the structural and performance requirements of the flexible substrate layer 130, for example.

Figure 7:
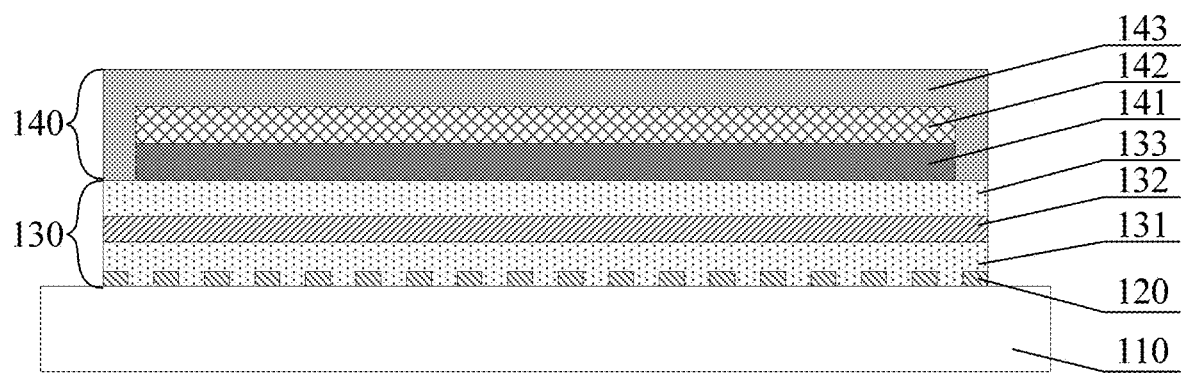
FIG. 7 is a schematic diagram of a process in the manufacturing method of the flexible display device provided by the embodiment of the disclosure.

Optionally, FIG. 7 is a schematic diagram of one process in the manufacturing method of the flexible display device provided by the embodiment of the disclosure. The flexible display device in the embodiment of the present disclosure may be, for example, a flexible OLED display device, wherein the display device 140 is, for example, an OLED device 140. The OLED device 140 may include a TFT layer 141, an OLED layer 142, and an encapsulation layer 143. Therefore, in the embodiment of the present disclosure, the implementation of preparing the display device on the flexible substrate layer 130 may include sequentially preparing the TFT layer 141, the OLED layer 142, and the encapsulation layer 143 on the second flexible base layer 133.

In the embodiment of the present disclosure, the flexible display device may be of different types. Different types of display devices have different manufacturing processes. Based on the multilayer structure of the flexible substrate layer 130 illustrated in FIG. 6, the display device 140 in the embodiment of the present disclosure is fabricated on the second flexible base layer 133, for example. It should be noted that the TFT layer 141 is a TFT array in the internal structure of an OLED device and is disposed on the second flexible base layer 133. The preparation processes of the TFT layer 141 are mainly Chemical Vapor Deposition (CVD), Sputter, photolithography, etching, etc. OLED layer 142 includes an OLED anode layer, a hole injection layer, a hole transport layer, an electron blocking layer, a light emitting layer, a hole blocking layer, an electron transport layer, an electron injection layer, an OLED cathode layer, etc. The encapsulation layer 143 is disposed on the OLED layer 142. The encapsulation layer 143 and the second flexible base layer 133 form an encapsulated space in which the TFT layer 141 and the OLED layer 142 are encapsulated. As illustrated in FIG. 7, the encapsulated space is a sealed structure, in which the TFT layer 141 and the OLED layer 142 are wrapped to prevent air and moisture from entering, so as to ensure the performance of TFT array and OLED light emitting structure.

Figure 8:
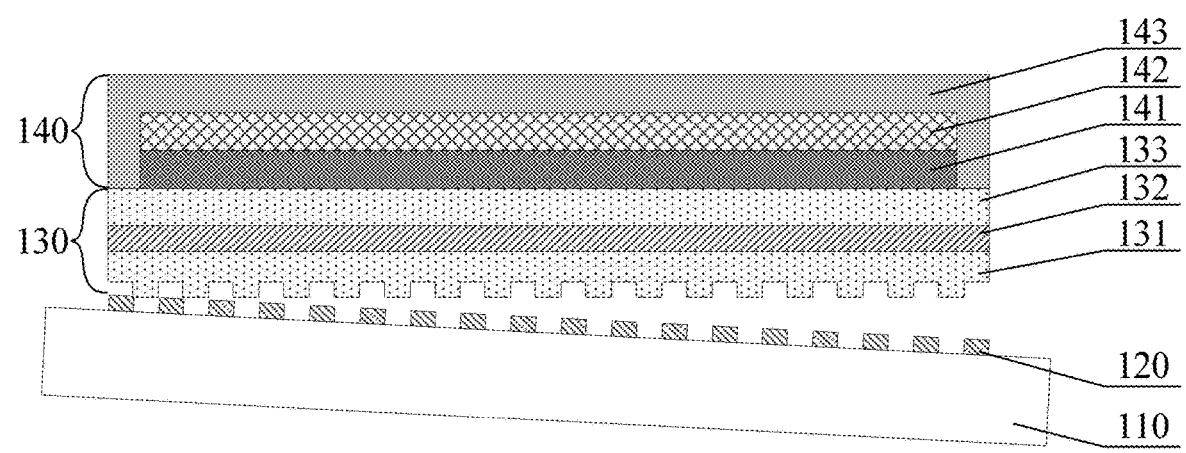
FIG. 8 is a schematic diagram of a process in the manufacturing method of the flexible display device provided by the embodiment of the disclosure.

FIG. 8 is a schematic diagram of a process in a manufacturing method of a flexible display device according to an embodiment of the present invention. FIG. 8 illustrates a process of separating the hard substrate 110 from the first flexible base layer 131 by heating the conductive heating layer 120. Since the conductive heating layer 120 is located on the side of the hard substrate 110 close to the first flexible base layer 131, the conductive heating layer 120 with microstructure pattern before separation is attached to the first flexible base layer 131. In the separation process, the heat generated by the conductive heating layer 120 separates the first flexible base layer 131 from the conductive heating layer 120 at the junction of the first flexible base layer 131 and the conductive heating layer 120, i.e., the hard substrate 110 and the first flexible base layer 131 are separated, and the conductive heating layer 120 is also separated from the first flexible base layer 131. The separated conductive heating layer 120 is located on the hard substrate 110, and the transparent graphene layer with high heat conductivity (heat dissipation layer 132) can effectively transfer heat and reduce local heat influence, thus blocking the influence of high temperature on the performance of the TFT layer 141 and the OLED layer 142, and improving the product yield of the flexible display device to a certain extent. In addition, since the transparent graphene layer has excellent mechanical properties such as high specific modulus, high toughness and the like, the transparent graphene layer is added to the flexible substrate layer as the heat dissipation layer 132, that is, is added between the first flexible base layer 131 and the second flexible base layer 133, thus effectively improving the mechanical properties of the flexible substrate layer, enabling the display device of the flexible display device to have better ductility, enabling the flexible display device to have higher thermal conductivity, and further improving the service life of the flexible display device.

It should be noted that, based on the multilayer structure of the flexible substrate layer 130 illustrated in FIG. 6, after the first flexible base layer 131 is peeled off from the conductive heating layer 120, a concave-convex microstructure pattern is formed on the side of the first flexible base layer 131 away from the display device 140. For double-sided or bottom-emitting OLED displays, the concave-convex microstructure pattern can effectively improve the light extraction efficiency.

Based on the manufacturing method of the flexible display device provided by the embodiments of the present disclosure, the embodiments of the present disclosure also provide a flexible display device. The flexible display device is manufactured by the manufacturing method provided by any of the above embodiments of the present disclosure.

Figure 9:
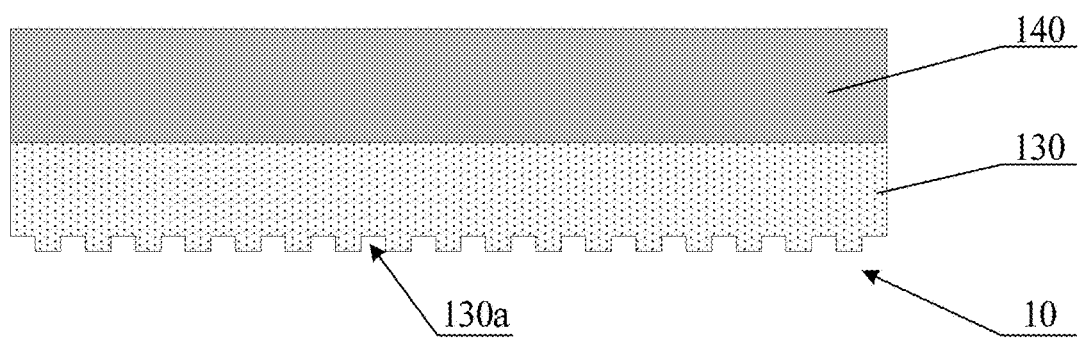
FIG. 9 is a schematic structural diagram of a flexible display device provided by an embodiment of the disclosure.

FIG. 9 is a schematic structural diagram of a flexible display device provided by an embodiment of the disclosure. The flexible display device 10 provided in this embodiment may include a flexible substrate layer 130 and a display device 140 disposed on the flexible substrate layer 130.

In the embodiment of the present disclosure, the side of the flexible substrate layer 130 away from the display device 140 is provided with a microstructure pattern 130a. The microstructure pattern 130a is generated by heating the conductive heating layer having the microstructure pattern on the side of the hard substrate close to the flexible substrate layer 130 when the flexible substrate layer 130 is separated from the conductive heating layer and separating the flexible substrate layer.

The flexible display device provided by the embodiment of the present disclosure is manufactured by the process of the manufacturing method illustrated in FIG. 1. Since the flexible display device 10 has a flexible substrate layer 130, the display device 140 disposed on the flexible substrate layer 130 can have a stretchable function and can form a curved surface or other display device with a stereoscopic display effect. In addition, due to the high stretchability of the flexible substrate layer 130 itself, it is difficult to directly fabricate the display device 140 on the flexible substrate layer 130. Therefore, the flexible substrate layer 130 can be fabricated on a hard substrate to have high stability in the fabrication process, and then the display device 140 can be fabricated on the flexible substrate layer 130 with a fixed structure.

In the embodiment of the present disclosure, the process of separating the flexible display device 10 from the hard substrate is, for example, the process of separating the flexible substrate layer 130 from the conductive heating layer on the side of the hard substrate close to the flexible substrate layer 130. The separation method is that the conductive heating layer is heated by energizing, so that the conductive heating layer generates sufficient heat to peel the flexible substrate layer 130 from the conductive heating layer. In the process of heating and separation, the heat generated by the conductive heating layer separates the flexible substrate layer 130 from the conductive heating layer at the junction of the flexible substrate layer 130 and the conductive heating layer, i.e. the effect of separating the hard substrate from the flexible substrate layer 130 is realized. The heating time and temperature are easy to control, which is beneficial to avoid the influence of excessive local heat on the performance of the display device and to improve the manufacturing yield of the flexible display device to a certain extent.

It should be noted that the microstructure pattern on the side of the flexible substrate layer 130 away from the display device 140 in the embodiment of the present disclosure is generated after the conductive heating layer is separated. It can be understood that the conductive heating layer adhered to the flexible substrate layer 130 has a pattern of complementary shape with the microstructure pattern on the side of the flexible substrate layer 130 away from the display device 140, which is illustrated by taking the grid pattern illustrated in FIG. 2 as an example. The grid pattern in FIG. 2 is the microstructure pattern of the conductive heating layer 120, and the dot matrix pattern inside the grid pattern is the microstructure pattern on the side of the flexible substrate layer 130 away from the display device 140. The microstructure pattern formed on the side of the flexible substrate layer 130 away from the display device 140 is beneficial to improving the light extraction efficiency, thereby further improving the service life of the display device.

It should also be noted that in the embodiment of the present disclosure, the microstructure pattern on the side of the flexible substrate layer 130 away from the display device 140 may also be a grid pattern, and, at this time, the microstructure pattern of the conductive heating layer is a dot matrix pattern. The embodiment of the present disclosure does not limit the specific shape of the microstructure pattern on the side of the flexible substrate layer 130 away from the display device 140, as long as the side of the separated flexible substrate layer 130 away from the display device 140 is not a flat structure, but has a concave-convex pattern structure, and the formed concave-convex pattern structure can improve the light extraction efficiency of the flexible display device, it can be used as the microstructure pattern on the side of the flexible substrate layer 130 away from the display device 140 in the embodiment of the present invention.

In the related art, the way to separate the flexible display device from the hard substrate, that is, to separate the flexible display device from the hard substrate by laser scanning the bottom of the hard substrate, is actually to heat the hard substrate to separate the hard substrate from the flexible substrate layer. However, in this separation technology, due to poor heat dissipation effect, the flexible substrate layer and TFT circuit are damaged to a greater extent, resulting in an increase in product failure rate. In addition, the process is not easy to control and the cost is relatively high by using laser scanning to separate the hard substrate and the flexible display.

The flexible display device provided by the embodiment of the disclosure comprises a flexible base layer and a display device, and a microstructure pattern is arranged on a side of the flexible substrate layer away from the display device. The display device is made on the flexible substrate layer, the flexible substrate layer is made on the hard substrate layer, and the microstructure pattern on the side of the flexible substrate layer away from the display device is formed by heating the conductive heating layer on the side of the hard substrate layer close to the flexible substrate layer when the flexible substrate layer is peeled off. According to the flexible display device provided by the disclosure, the microstructure pattern on the side of the flexible substrate layer away from the display device is beneficial to improving the light extraction efficiency, thereby improving the service life of the display device; and the separation mode for forming the microstructure pattern can avoid damage to the display device caused by laser energy in the traditional separation process, thereby further improving the service life of the display device.

Figure 10:
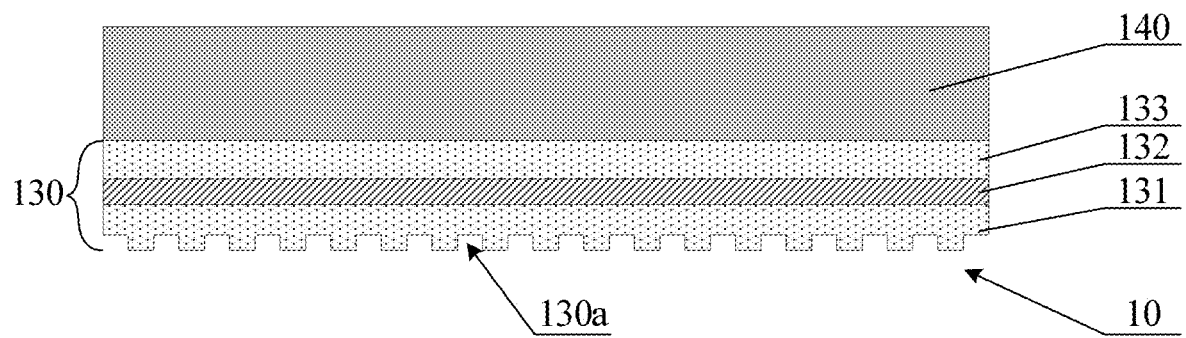
FIG. 10 is a schematic structural diagram of another flexible display device provided by an embodiment of the disclosure.

Optionally, FIG. 10 is a schematic structural diagram of another flexible display device provided by an embodiment of the disclosure. On the basis of the structure of the flexible display device 10 illustrated in FIG. 9, ill the flexible display device 10 provided by the embodiment of the present disclosure, the flexible substrate layer 130 includes a second flexible base layer 133 which is arranged to attached with the display device 140, and a heat dissipation layer 132 and a first flexible base layer 131 which are sequentially arranged on the side of the second flexible base layer 133 away from the display device 140. The microstructure pattern 130a is disposed on a side of the first flexible base layer 131 away from the display device 140, for example.

The flexible substrate layer 130 in the embodiment of the present disclosure is a multi-layer structure, which may include a first flexible base layer 131, a heat dissipation layer 132, and a second flexible base layer 133 as illustrated in FIG. 10. The first flexible base layer 131 is disposed on the outermost side of the flexible display device 10 (i.e., the outermost side of the flexible display device 10 facing away from the display device 140), and the display device 140 is prepared on the second flexible base layer 133, for example. In some examples, a heat dissipation layer 132 is provided on the side of the second flexible base layer 133 away from the display device 140. The heat dissipation layer 132 is used to effectively dissipate heat and reduce local thermal effects when the flexible display device 10 is electrically heated and separated, thereby blocking the influence of high temperature on the display device and improving the product yield of the flexible display device.

It should be noted that based on the multi-layer structure of the flexible substrate layer 130 illustrated in FIG. 10, it can be seen that the first flexible base layer 131 is disposed on the outermost side of the flexible display device 10 (i.e., the outermost side of the flexible display device 10 facing away from the display device 140), and the first flexible base layer 131 is bonded with the conductive heating layer (or the conductive heating layer and the hard substrate) before the flexible display device 10 is separated. The outermost layer at the bottom of the separated flexible display device 10 (i.e., the outermost layer on the side of the flexible display device 10 facing away from the display device 140) is the first flexible base layer 131. Therefore, in the separated flexible substrate layer 130, the concave-convex microstructure pattern is formed on the side of the first flexible base layer 131 facing away from the display device 140. For double-sided or bottom-emitting OLED displays, the concave-convex microstructure pattern can effectively improve the light extraction efficiency. In addition, the microstructure pattern on the side of the first flexible base layer 131 away from the display device 140 and the microstructure pattern of the conductive heating layer are complementary patterns, and reference can be made to the filled region and the unfilled region in FIG. 2.

Optionally, in the embodiment of the present disclosure, the first flexible base layer 131 and the second flexible base layer 133 may be made of PI material, and the thickness of the first flexible base layer 131 and the second flexible base layer 133 may be from 10 to 50 μm. The material selection and thickness of the first flexible base layer 131 and the second flexible base layer 133 are determined according to the structural and performance requirements of the flexible substrate layer 130, for example.

Optionally, in the embodiment of the present disclosure, the heat dissipation layer 132 may be a material with strong heat conduction and heat dissipation performance, so as to achieve a good heat dissipation effect. Optionally, if the flexible display device 10 is a double-sided or bottom-emitting OLED display, the heat dissipation layer 132 may be a transparent graphene layer.

In some examples, the transparent graphene layer may be composed of, for example, a plurality of transparent graphene films sequentially attached to the first flexible base layer 131. The transparent graphene is currently the thinnest but hardest nano material, is almost completely transparent, and has a thermal conductivity as high as 5300 W/m·K, which is higher than that of carbon nanotubes and diamond, thus having high thermal conductivity and heat dissipation performance.

In one implementation of the embodiment of the present disclosure, the thickness of the transparent graphene layer may be between 5 to 25 μm. According to the thickness calculation of the transparent graphene film, the heat dissipation layer 132 may include approximately 14900 to 74600 layers of transparent graphene films.

In another implementation of the embodiment of the present disclosure, the heat dissipation layer 132 can be obtained by uniformly depositing 5 to 25 μm transparent graphene material on the first flexible base layer 131.

Figure 11:
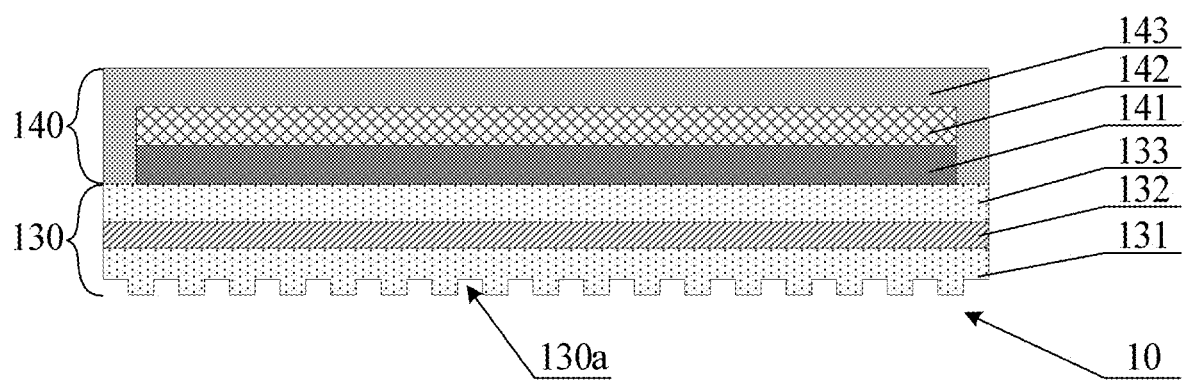
FIG. 11 is a schematic structural diagram of another flexible display device provided by an embodiment of the disclosure.

Optionally, FIG. 11 is a schematic structural diagram of another flexible display device provided by the embodiment of the disclosure. Based on the structure of the flexible display device 10 illustrated in FIG. 10, in the flexible display device 10 of the embodiment of the disclosure, the flexible display device 10 is a flexible OLED display device, and its display device 140 is, for example, an OLED device 140, which includes a TFT layer 141, an OLED layer 142, and an encapsulation layer 143 that are sequentially disposed away from the second flexible base layer 133.

In the embodiment of the present disclosure, the flexible display device 10 may have different types, and the display device 140 may have different types and specific structures. Based on the multilayer structure of the flexible substrate layer 130 and the internal layer structures of the display device 140, the display device 140 in the embodiment of the present disclosure is disposed on the second flexible base layer 133, for example. It should be noted that the TFT layer 141 in the display device 140 is a TFT array in the internal structure of the OLED device and is disposed on the second flexible base layer 133. The OLED layer 142 includes an OLED anode layer, a hole injection layer, a hole transport layer, an electron blocking layer, a light emitting layer, a hole blocking layer, an electron transport layer, an electron injection layer, an OLED cathode layer, etc. The encapsulation layer 143 is disposed on the OLED layer 142. The encapsulation layer 143 and the second flexible base layer 133 form an encapsulated space in which the TFT layer 141 and the OLED layer 142 are encapsulated. As illustrated in FIG. 11, the encapsulated space is a sealed structure, in which the TFT layer 141 and the OLED layer 142 are wrapped to prevent air and moisture from entering, so as to ensure the performance of the TFT array and the OLED light emitting structure.

The foregoing is merely exemplary embodiments of the invention, but is not used to limit the protection scope of the invention. The protection scope of the invention shall be defined by the attached claims.

The invention claimed is:

1. A manufacturing method of a flexible display device, comprising:
    forming a conductive heating layer with a first microstructure pattern on a hard substrate;
    forming a flexible substrate layer on the conductive heating layer, and forming a display device on the flexible substrate layer; and
    performing a heating treatment on the conductive heating layer to separate the flexible substrate layer from the conductive heating layer, and a side of the flexible substrate layer away from the display device having a second microstructure pattern after being separated,
    wherein forming the flexible substrate layer on the conductive heating layer comprises:
    forming a first flexible base layer, a heat dissipation layer and a second flexible base layer on the conductive heating layer sequentially.

2. The manufacturing method of the flexible display device according to claim 1, wherein forming the conductive heating layer with the first microstructure pattern on the hard substrate comprises:
    forming a conductive heating film on the hard substrate; and
    performing a patterning process on the conductive heating film to form the conductive heating layer with the first microstructure pattern.

3. The manufacturing method of the flexible display device according to claim 1, wherein, in the flexible substrate layer after being separated, a side of the first flexible base layer away from the display device has the second microstructure pattern.

4. The manufacturing method of the flexible display device according to claim 1, wherein the first flexible base layer and the second flexible base layer are made of polyimide fibers, and both the first flexible base layer and the second flexible base layer have a thickness from 10 microns to 50 microns.

5. The manufacturing method of the flexible display device according to claim 1, wherein the heat dissipation layer is a transparent graphene layer including a plurality of transparent graphene films, and the heat dissipation layer has a thickness from 5 microns to 25 microns.

6. The manufacturing method of the flexible display device according to claim 1, wherein the display device is an organic light emitting diode device, and forming the display device on the flexible substrate layer comprises:
    forming a thin film transistor layer, an organic light emitting diode layer and an encapsulation layer on the second flexible base layer sequentially.

7. The manufacturing method of the flexible display device according to claim 6, wherein the encapsulation layer and the flexible substrate layer form an encapsulated space, and the thin film transistor layer and the organic light emitting diode layer are encapsulated in the encapsulated space.

8. The manufacturing method of the flexible display device according to claim 1, wherein the second microstructure pattern on the side of the flexible substrate layer away from the display device and the first microstructure pattern of the conductive heating layer are complementary patterns.

9. The manufacturing method of the flexible display device according to claim 1, wherein a material of the conductive heating layer comprises at least one of iron chromium alloy or nickel chromium alloy.

10. The manufacturing method of the flexible display device according to claim 1, wherein the first microstructure pattern of the conductive heating layer is a grid pattern or a dot array pattern.

11. A flexible display device comprising: a flexible substrate layer and a display device disposed on the flexible substrate layer;
wherein a side of the flexible substrate layer away from the display device is provided with a microstructure pattern,
wherein the flexible substrate layer comprises: a second flexible base layer, a heat dissipation layer and a first flexible base layer which are sequentially arranged in a direction from a position close to the display device to a position away from the display device; the microstructure pattern is provided on a side of the first flexible base layer away from the display device.

12. The flexible display device according to claim 11, wherein the microstructure pattern is a grid pattern or a dot array pattern.

13. The flexible display device according to claim 11, wherein the first flexible base layer and the second flexible base layer are made of polyimide fibers, and both the first flexible base layer and the second flexible base layer have a thickness from 10 microns to 50 microns.

14. The flexible display device according to claim 11, wherein the heat dissipation layer is a transparent graphene layer including a plurality of transparent graphene films, and the heat dissipation layer has a thickness from 5 microns to 25 microns.

15. The flexible display device according to claim 11, wherein the display device is an organic light emitting diode device, and the organic light emitting diode device comprises a thin film transistor layer, an organic light emitting diode layer and an encapsulation layer which are sequentially arranged in a direction away from the second flexible base layer.

16. The flexible display device according to claim 15, wherein the encapsulation layer and the flexible substrate layer form an encapsulated space in which the thin film transistor layer and the organic light emitting diode layer are encapsulated.

17. The flexible display device according to claim 11, wherein the microstructure pattern is generated after a patterned conductive heating layer on a hard substrate is heated and the flexible substrate layer is separated from the patterned conductive heating layer.

18. The flexible display device according to claim 17, wherein the microstructure pattern on the side of the flexible substrate layer away from the display device and a pattern of the conductive heating layer are complementary patterns.

* * * * *